(12) United States Patent
Hou et al.

(10) Patent No.: US 12,387,776 B2
(45) Date of Patent: Aug. 12, 2025

(54) ELECTRONIC DEVICE AND CONTROL METHOD FOR MEMORY REFRESH OPERATION THEREOF

(71) Applicant: Winbond Electronics Corp., Taichung (TW)

(72) Inventors: Chien-Ti Hou, Taichung (TW); Ying-Te Tu, Taichung (TW); Cheng Han Lee, Taichung (TW)

(73) Assignee: Winbond Electronics Corp., Taichung (TW)

( * ) Notice: Subject to any disclaimer, the term of this patent is extended or adjusted under 35 U.S.C. 154(b) by 213 days.

(21) Appl. No.: 18/475,172

(22) Filed: Sep. 26, 2023

(65) Prior Publication Data
US 2024/0420751 A1   Dec. 19, 2024

(30) Foreign Application Priority Data

Jun. 17, 2023 (TW) ................................ 112122796

(51) Int. Cl.
*G11C 11/40* (2006.01)
*G11C 11/406* (2006.01)
*G11C 11/4076* (2006.01)

(52) U.S. Cl.
CPC ... *G11C 11/40611* (2013.01); *G11C 11/40603* (2013.01); *G11C 11/4076* (2013.01)

(58) Field of Classification Search
CPC ......... G11C 11/40611; G11C 11/40603; G11C 11/4076; G11C 11/40607
See application file for complete search history.

(56) References Cited

U.S. PATENT DOCUMENTS

| | | | |
|---|---|---|---|
| 7,313,045 B2 | 12/2007 | Hosokawa et al. | |
| 8,711,647 B2 | 4/2014 | Wang | |
| 8,873,324 B2 | 10/2014 | Park et al. | |
| 9,349,431 B1 | 5/2016 | Saifuddin et al. | |
| 9,437,274 B1 | 9/2016 | Kim et al. | |
| 2015/0171847 A1* | 6/2015 | Kodama | H03K 5/13 327/299 |
| 2021/0366535 A1* | 11/2021 | Kim | G11C 11/4076 |

* cited by examiner

*Primary Examiner* — Uyen Smet
(74) *Attorney, Agent, or Firm* — JCIPRNET

(57) ABSTRACT

An electronic device and a control method for memory refresh operation thereof are provided. The electronic device includes a memory and a controller. The memory includes a plurality of timers, a plurality of buffers and an interrupt signal generator. Each of the buffers is configured to store at least one word line information, and generate a refresh word line information according to a timing result trigger signal of each corresponding timer. The interrupt signal generator generates an interrupt signal corresponding to an auto refresh operation according to the timing result trigger signal, a non-internal self-refresh mode signal and a non-accessing status. The controller receives the interrupt signal and transmits an auto refresh command to the memory according to the interrupt signal to enable the memory to perform the auto refresh operation.

20 Claims, 8 Drawing Sheets

ELECTRONIC DEVICE AND CONTROL METHOD FOR MEMORY REFRESH OPERATION THEREOF

CROSS-REFERENCE TO RELATED APPLICATION

This application claims the priority benefit of Taiwan application serial no. 112122796, filed on Jun. 17, 2023. The entirety of the above-mentioned patent application is hereby incorporated by reference herein and made a part of this specification.

BACKGROUND

Technical Field

The invention relates to an electronic device and a control method for memory refresh operation thereof, and particularly relates to an electronic device capable of avoiding unnecessary refresh operations and a control method for memory refresh operation thereof.

Description of Related Art

In a dynamic random access memory, in order to ensure correctness of stored data, memory cells need to perform refresh operations regularly. In the conventional technology, the refresh operations may be divided into two types: an internal self-refresh (SR) operation and an auto-refresh (AR) operation. Regardless of the type of the refresh operation, in the prior art, the refresh operations are performed on all word lines in the memory based on the strictest conditions. Namely, in the conventional technical field, the practice of performing the refresh operations on all word lines regardless of data retentions may cause power consumption due to multiple unnecessary refresh operations, and affect an access bandwidth of the memory, thereby reducing the overall efficiency of the electronic device.

SUMMARY

The invention is directed to an electronic device and a control method for memory refresh operation thereof, which are adapted to avoid unnecessary refresh operations of a memory through intelligent refresh operations, reduce power consumption, and improve a performance of the refresh operations. The control method is adapted to be used for both of an internal self-refresh (SR) operation and an auto-refresh (AR) operation.

The invention provides an electronic device including a memory and a controller. The memory includes a plurality of timers, a plurality of buffers and an interrupt signal generator. The buffers are respectively coupled to the timers, and each of the buffers is configured to store at least one word line information, and generate a refresh word line information according to a timing result trigger signal of each corresponding timer. The interrupt signal generator generates an interrupt signal corresponding to an auto-refresh operation according to the timing result trigger signals of the timers, a non-internal self-refresh mode signal and a non-access state. The controller is coupled to the memory, and receives the interrupt signal and transmits an auto-refresh command to the memory according to the interrupt signal to enable the memory to perform the auto-refresh operation.

The invention provides a control method for memory refresh operation including: setting a plurality of buffers and a plurality of timers respectively corresponding to the buffers in a memory; using each buffer to store at least one word line information, and generate a refresh word line information according to a timing result trigger signal of each corresponding timer; generating an interrupt signal corresponding to an auto-refresh operation by the memory according to the timing result trigger signals of the timers, a non-internal self-refresh mode signal and a non-access state; making a controller outside the memory to receive the interrupt signal and transmit an auto-refresh command to the memory according to the interrupt signal to enable the memory to perform the auto-refresh operation.

Based on the above description, the memory of the invention may actively generate the interrupt signal, so that the controller may generate an auto-refresh command according to the interrupt signal, and drive the memory to perform the auto-refresh operation. The memory in the embodiment of the invention includes multiple word line groups, and refresh operations are performed on the different word line groups based on different refresh frequencies, which may avoid unnecessary refresh operations, reduce unnecessary power consumption and improve memory access performance.

DESCRIPTION OF THE EMBODIMENTS

Figure 1:
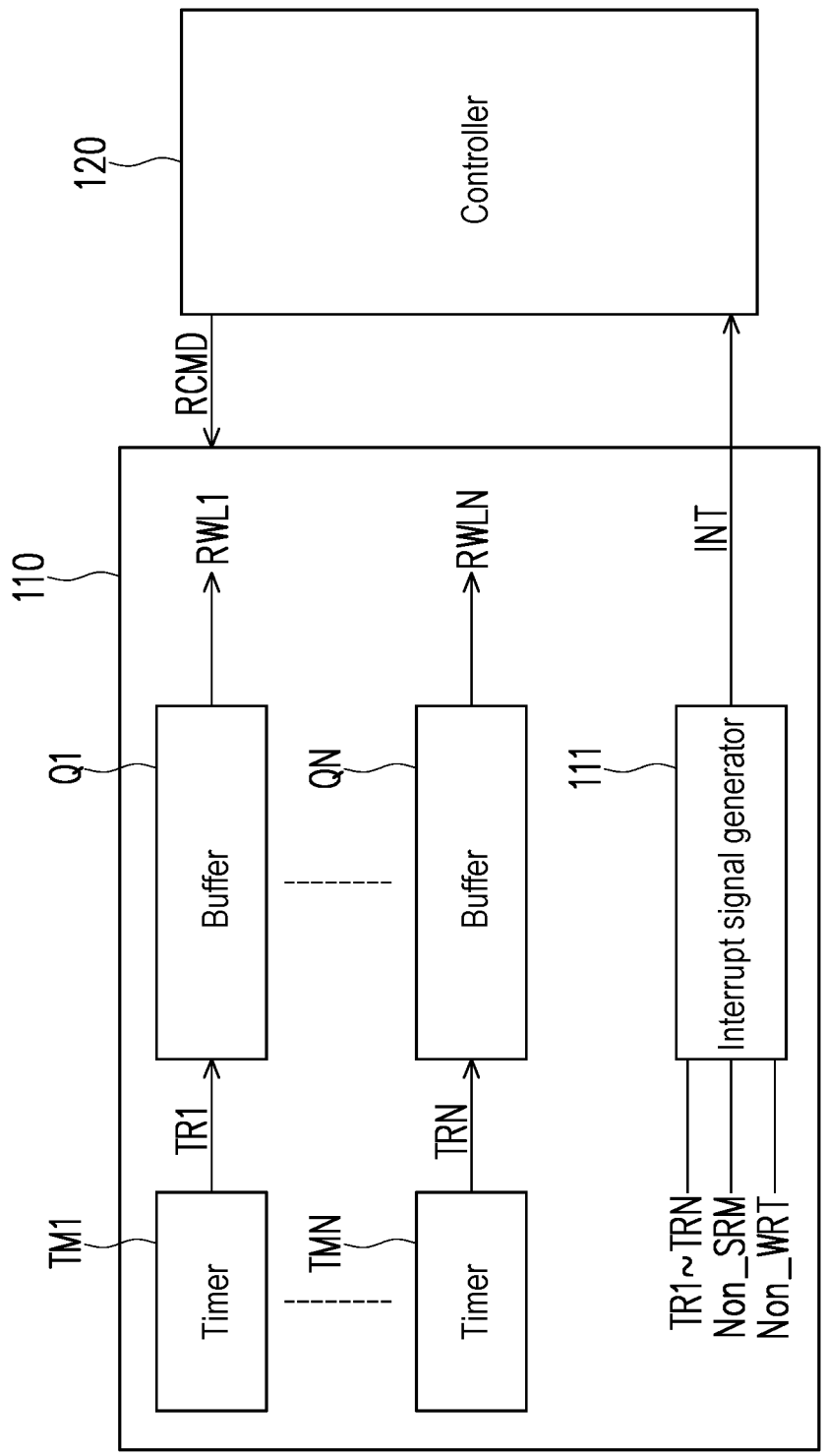
FIG. 1 is a schematic diagram of an electronic device according to an embodiment of the invention.

Referring to FIG. 1, the electronic device 100 includes a memory 110 and a controller 120. The memory 110 is coupled to the controller 120. The memory 110 includes a plurality of timers TM1-TMN, a plurality of buffers Q1-QN and an interrupt signal generator 111. The timers TM1-TMN correspond to the buffers Q1-QN respectively. The buffers Q1-QN may respectively form a plurality of queues, and each of the buffers Q1-QN is used to store at least one word line information. Where, the memory 110 may have a plurality of word lines. In the embodiment, the word lines in the memory 110 may be divided into a plurality of word line groups according to data retentions of memory cells. The related word line information of the above plurality of word line groups may be respectively stored in the corresponding buffers Q1-QN.

In the embodiment of the invention, the buffers Q1-QN may respectively correspond to a plurality of different data retentions. For example, the buffer Q1 may be used to store related word line information of the word line group with the lowest data retention; the buffer Q2 may be used to store related word line information of the word line group with the secondary lowest data retention. Deduced by analogy, the buffer QN may be used to store the related word line information of the word line group with the highest data retention.

The timers TM1-TMN may be respectively set corresponding to the buffers Q1-QN. The timers TM1-TMN may respectively have a plurality of different timing target values. Taking the timer TM1 as an example, in response to a timing value of the timer TM1 being equal to the corresponding timing target value, the timer TM1 may generate a timing result trigger signal TR1 to enable the corresponding buffer Q1 to generate corresponding refresh word line information RWL1. In addition, taking the timer TMN as an example, in response to the timing value of the timer TMN being equal to the corresponding timing target value, the timer TMN generates a timing result trigger signal TRN to enable the corresponding buffer QN to generate corresponding refresh word line information RWLN.

The memory 110 may perform an internal self-refresh (SR) operation for the memory cells on the corresponding word lines according to the refresh word line information RWL1-RWLN.

The word line information in each of the buffers Q1-QN is stored in a queue. Therefore, each time in response to the timers TM1-TMN triggering the timing result trigger signals TR1-TRN (i.e., the timing value is equal to the corresponding timing target value), each of the buffers Q1-QN may output one of the stored at least one word line information according to the timing result trigger signals TR1-TRN triggered by each of the corresponding timers TM1-TMN, so as to generate each of the refresh word line information RWL1-RWLN. Here, if the buffer Q1 corresponds to a word line group with a relatively low data retention, the timer TM1 corresponding to the buffer Q1 has a relatively low timing target value. If the buffer QN corresponds to a word line group with a relatively high data retention, the timer TMN corresponding to the buffer QN has a relatively high timing target value. It may be clearly understood here that the timing result trigger signal TR1 of the timer TM1 may have a relatively high trigger frequency. Therefore, the memory cells on the word line corresponding to the word line information recorded in the buffer Q1 may have a relatively high frequency to execute a refresh operation, and effectively maintain correctness of data. Comparatively, the timing result trigger signal TRN of the timer TMN may have a relatively low trigger frequency. Therefore, the memory cells on the word line corresponding to the word line information recorded in the buffer QN may have a relatively low frequency to execute the self-refresh operation, which may effectively reduce unnecessary power consumption.

The timing target values of the timers TM1-TMN may be set according to data retention time of the word line groups in the corresponding buffers Q1-QN. Each timing target value may be lower than the data retention time of the corresponding word line group. For example, if the data retention time of the word line group is between 60 and 64 ms, the corresponding timing target value may be set to 30 ms.

It should be noted that, in the embodiment of the invention, the interrupt signal generator 111 may generate an interrupt signal INT corresponding to an auto-refresh operation according to the timing result trigger signals TR1-TRN of the timers TM1-TMN, a non-self-refresh mode signal Non_SRM and a non-access state Non-WRT. Where, the interrupt signal generator 111 may learn whether the memory 110 is performing an internal self-refresh operation according to an internal self-refresh mode signal SRM. The interrupt signal generator 111 may learn whether the memory 110 is accessed (data is written or read) according to an access state WRT. The timing result trigger signals TR1-TRN of the timers TM1-TMN may respectively indicate whether a timing action of each of the timers TM1-TMN is in a time-out state. The interrupt signal generator 111 may generate the interrupt signal INT corresponding to the auto-refresh operation in response to at least one of the timers TM1-TMN being suspended in a state that the memory 110 is not performing a self-refresh operation and is not being accessed.

It should be noted that the memory 110 may transmit the actively generated interrupt signal INT to the controller 120 outside the memory 110. The controller 120 may send a refresh command RCMD to the memory 110 according to the interrupt signal INT, so that the memory 110 performs a refresh operation. In the embodiment, the refresh command RCMD is, for example, an auto-refresh command.

In the embodiment, the memory 110 transmits the interrupt signal INT to the controller 120 under the condition that the auto-refresh operation may be performed. The controller 120 may send the auto-refresh command to the memory 110 according to the interrupt signal INT, so that the memory 110 may effectively perform the auto-refresh operation. In this way, the performance of the auto-refresh operation of the memory 110 may be improved, and reliability of data stored in the memory 110 may be effectively maintained.

It should be noted that the controller 120 may be a processor with a computing power outside the memory, or the controller 120 may be a hardware circuit designed through a hardware description language (HDL) or any other digital circuit design methods known to those skilled in the art, and implemented through a field programmable gate array (FPGA), a complex programmable logic device (CPLD) or an application-specific integrated circuit (ASIC).

Figure 2:
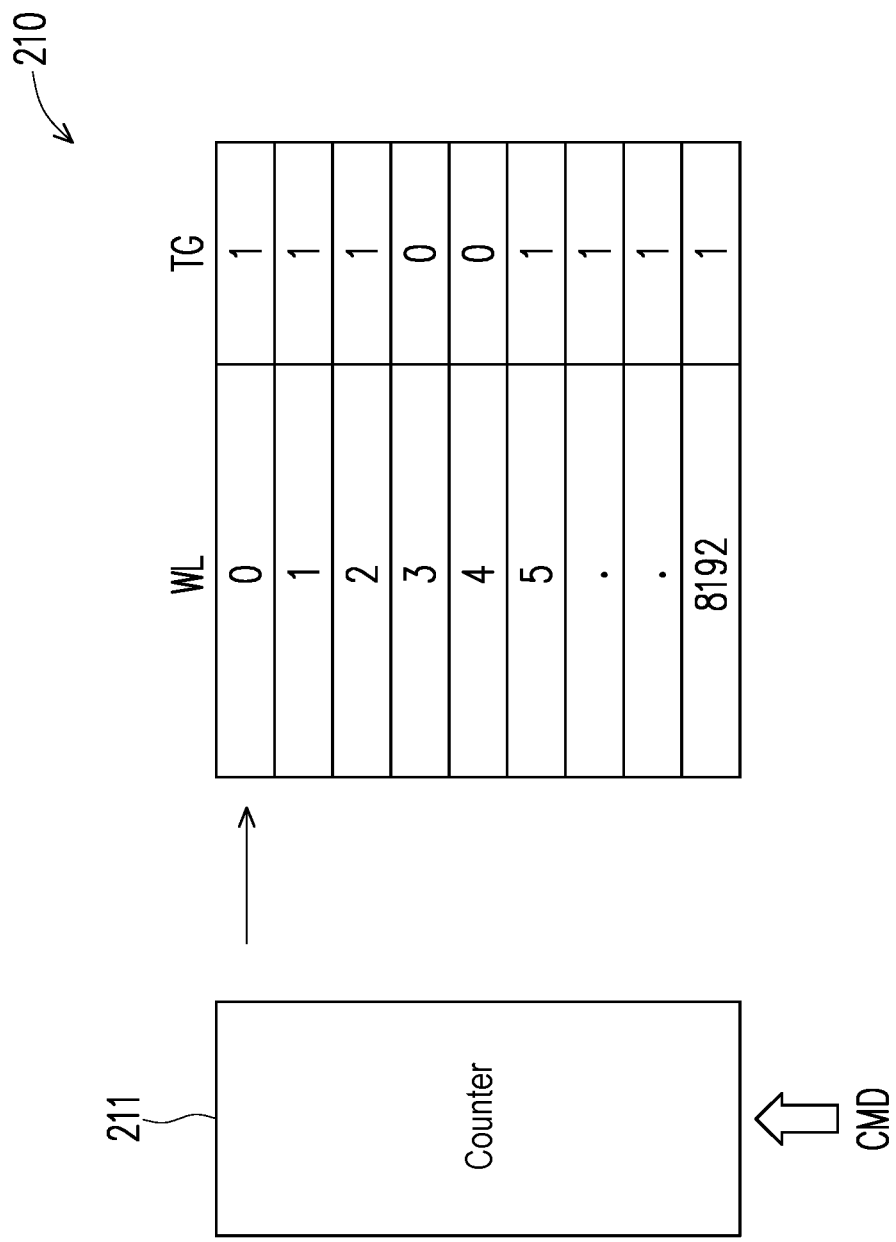
FIG. 2 is a schematic diagram of a method for generating word line information according to an embodiment of the invention.

Referring to FIG. 2, in the embodiment, a lookup table 210 may be set in the memory. The lookup table 210 may record a plurality of tags TG corresponding to a plurality of word lines of the memory. Where, a test device may be used to test data retentions of multiple word lines of the memory, and classify the data retentions of each of the word lines, and set corresponding tags. In FIG. 2, taking the 8193 word lines in the memory as an example, the data retention of the word lines 3 and 4 may be taken as a first level, and the data retention of the rest of the word lines may be taken as a second level. The lookup table 210 may record the tags TG of the word lines 3 and 4 as logic 0 (which means that the data retention is low and high-frequency refresh is required), and record the tags TG of the word lines 0, 1, 2, ... 8192 as logic 1 (which means that the data retention is high, and only low-frequency refresh is required). Therefore, many unnecessary refresh operations may be saved.

In response to the power of the memory being turned on, according to a refresh operation command CMD, a counter 211 may be activated for counting. Along with the counting operation of the counter 211, the tags corresponding to the word lines 0-8192 in the lookup table 210 may be gradually read out. The related word line information corresponding to the word line whose tag TG is equal to logic 0 may be stored in a first buffer (such as the buffer Q1 of FIG. 1), and the related word line information corresponding to the word line whose tag TG is equal to logic 1 may be stored in a second buffer (such as the buffer QN of FIG. 1).

Figure 3:
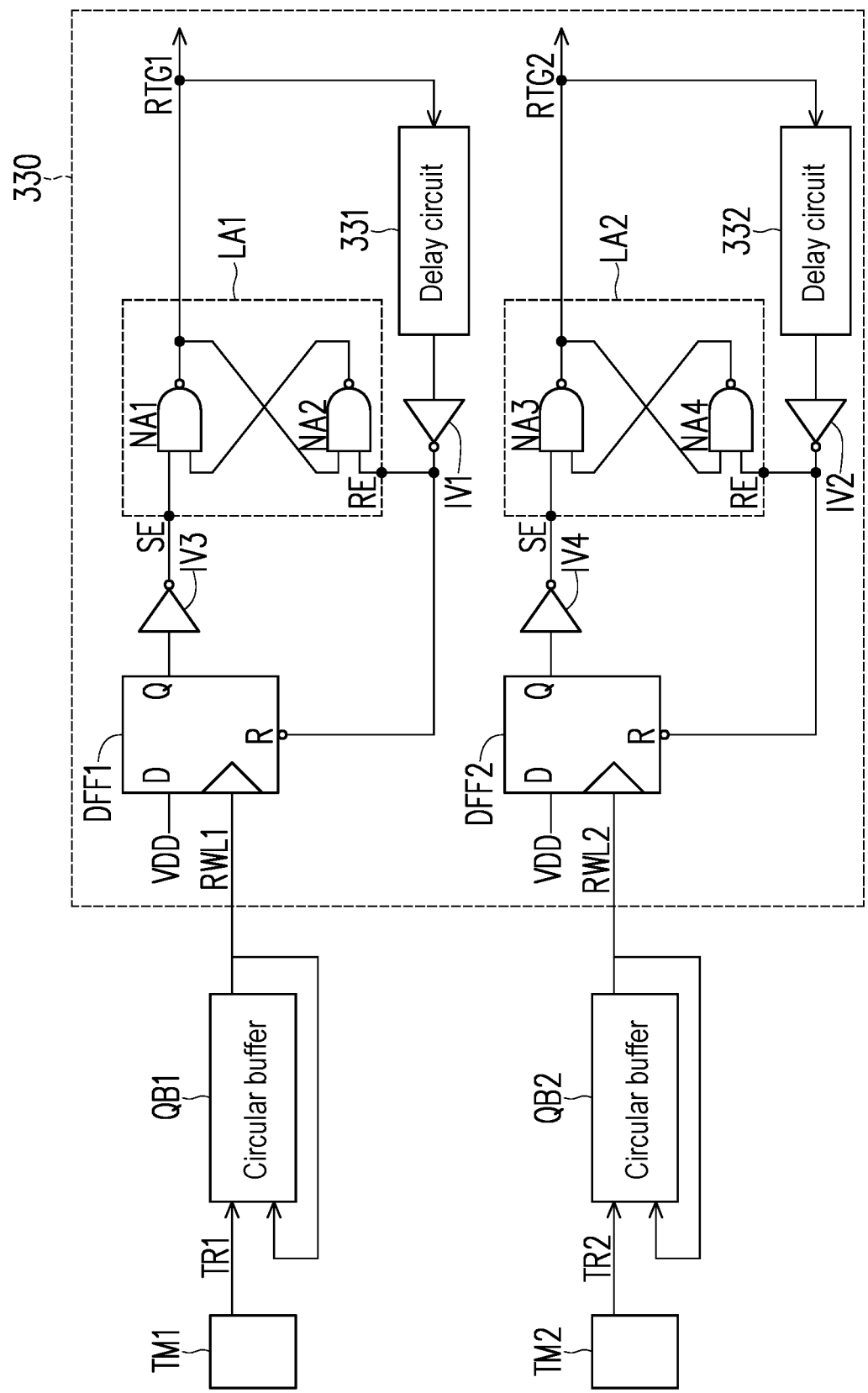
FIG. 3 is a schematic diagram of partial circuit of a memory in an electronic device according to an embodiment of the invention.

Referring to FIG. 3, the memory 300 includes timers TM1, TM2, circular buffers QB1, QB2 and an arbitration circuit 330. The buffers QB1, QB2 are respectively coupled to the corresponding timers TM1, TM2. The timers TM1 and TM2 are respectively used to generate timing result trigger signals TR1 and TR2. The arbitration circuit 330 is coupled to the buffers QB1, QB2, and is used for respectively generating a plurality of trigger signals RTG1, RTG2 to trigger the refresh operations according to the refresh word line information RWL1, RWL2. The arbitration circuit 330 includes a plurality of trigger signal generating circuits. A first trigger signal generating circuit is coupled to the buffer QB1, and a second trigger signal generating circuit is coupled to the buffer QB2. The first trigger signal generating circuit includes a flip-flop DFF1, a latch LA1, an inverter IV1 and a delay circuit 331. The second trigger signal generating circuit includes a flip-flop DFF2, a latch LA2, an inverter IV2 and a delay circuit 332.

A data terminal D of the flip-flop DFF1 may receive a power supply voltage VDD of logic 1, a clock terminal of the flip-flop DFF1 receives the refresh word line information RWL1, and an output terminal Q of the flip-flop DFF1 is coupled to an input terminal of an inverter IV3, and an output terminal of the inverter IV3 is coupled to a setting terminal SE of the latch LA1. The latch LA1 is a set-reset latch (SR latch). The latch LA1 is composed of NAND gates NA1 and NA2, and an output terminal of the latch LA1 is used to generate the trigger signal RTG1. The delay circuit 331 is coupled to the output terminal of the latch LA1 to delay the trigger signal RTG1, and the delayed trigger signal is further inverted by the inverter IV1 to generate a reset signal, and the reset signal is transmitted to a reset terminal R of the flip-flop DFF1 and a reset terminal RE of the latch LA1.

A data terminal D of the flip-flop DFF2 may receive the power supply voltage VDD of logic 1, a clock terminal of the flip-flop DFF2 receives the refresh word line information RWL2, and an output terminal Q of the flip-flop DFF2 is coupled to an input terminal of an inverter IV4, and an output terminal of the inverter IV4 is coupled to a setting terminal SE of the latch LA2. The latch LA2 is a set-reset latch (SR latch). The latch LA2 is composed of NAND gates NA3 and NA4, and an output terminal of the latch LA2 is used to generate the trigger signal RTG2. The delay circuit 332 is coupled to the output terminal of the latch LA2 to delay the trigger signal RTG2, and the delayed trigger signal is further inverted by the inverter IV2 to generate a reset signal, and the reset signal is transmitted to a reset terminal R of the flip-flop DFF2 and a reset terminal RE of the latch LA2.

In terms of operation details, taking the first trigger signal generating circuit as an example, in response to the refresh word line information RWL1 being triggered according to the time-out state of the timing result trigger signal TR1, the flip-flop DFF1 may generate an output signal. The latch LA1 may set the trigger signal RTG1 according to the output signal of the flip-flop DFF1 and trigger the refresh operation of the corresponding word line.

After a delay time of the trigger signal RTG1, the delay circuit 331 and the inverter IV1 may generate a reset signal according to the trigger signal RTG1, and enable the flip-flop DFF1 and the latch LA1 to perform a reset operation.

The operation details of the second trigger signal generating circuit are similar to those of the first trigger signal generating circuit, which are not repeated here.

Figure 4A:
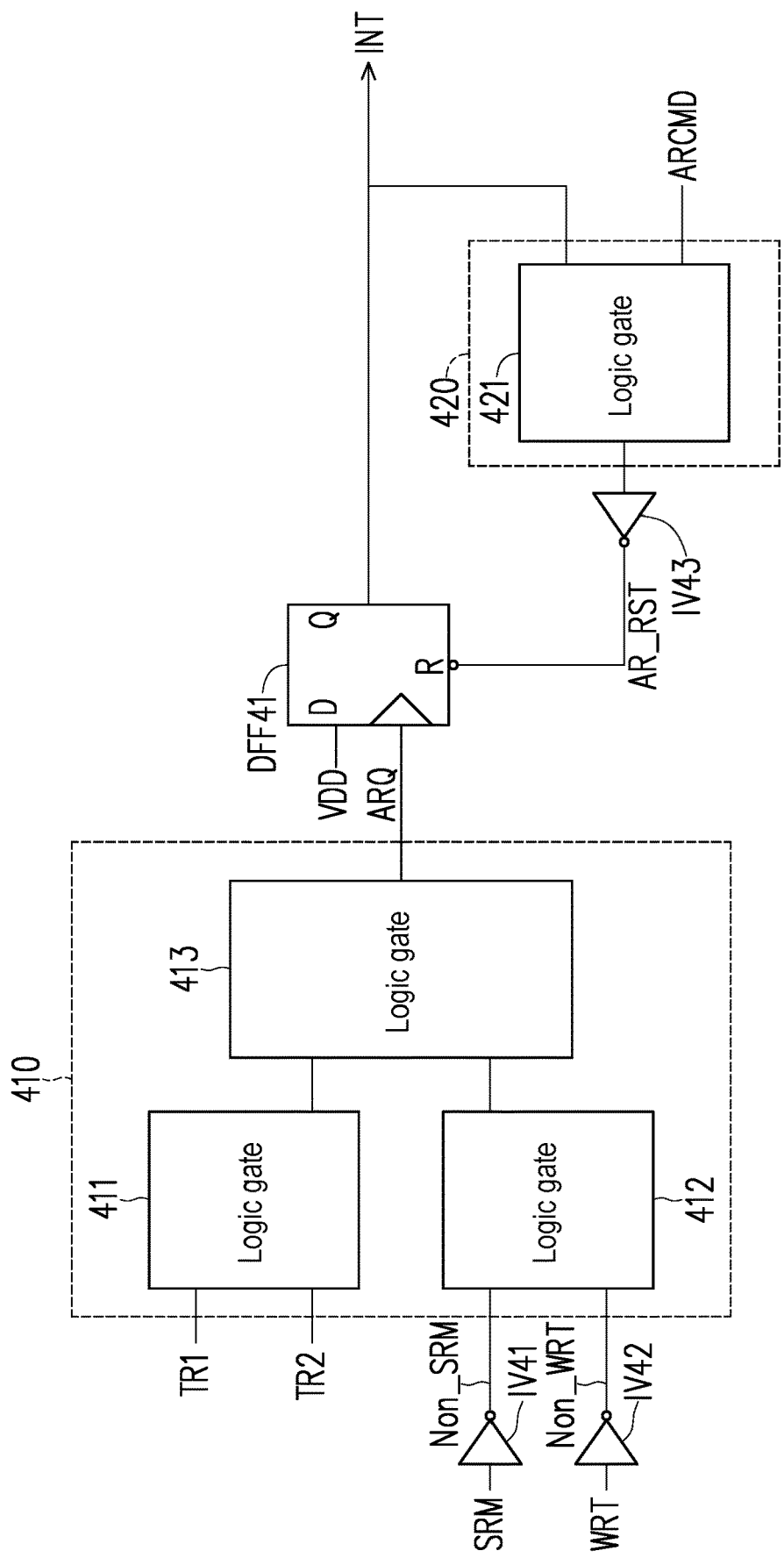
FIG. 4A and FIG. 4B are schematic diagrams of different implementations of an interrupt signal generator in a memory of an electronic device according to an embodiment of the invention.
Figure 4B:
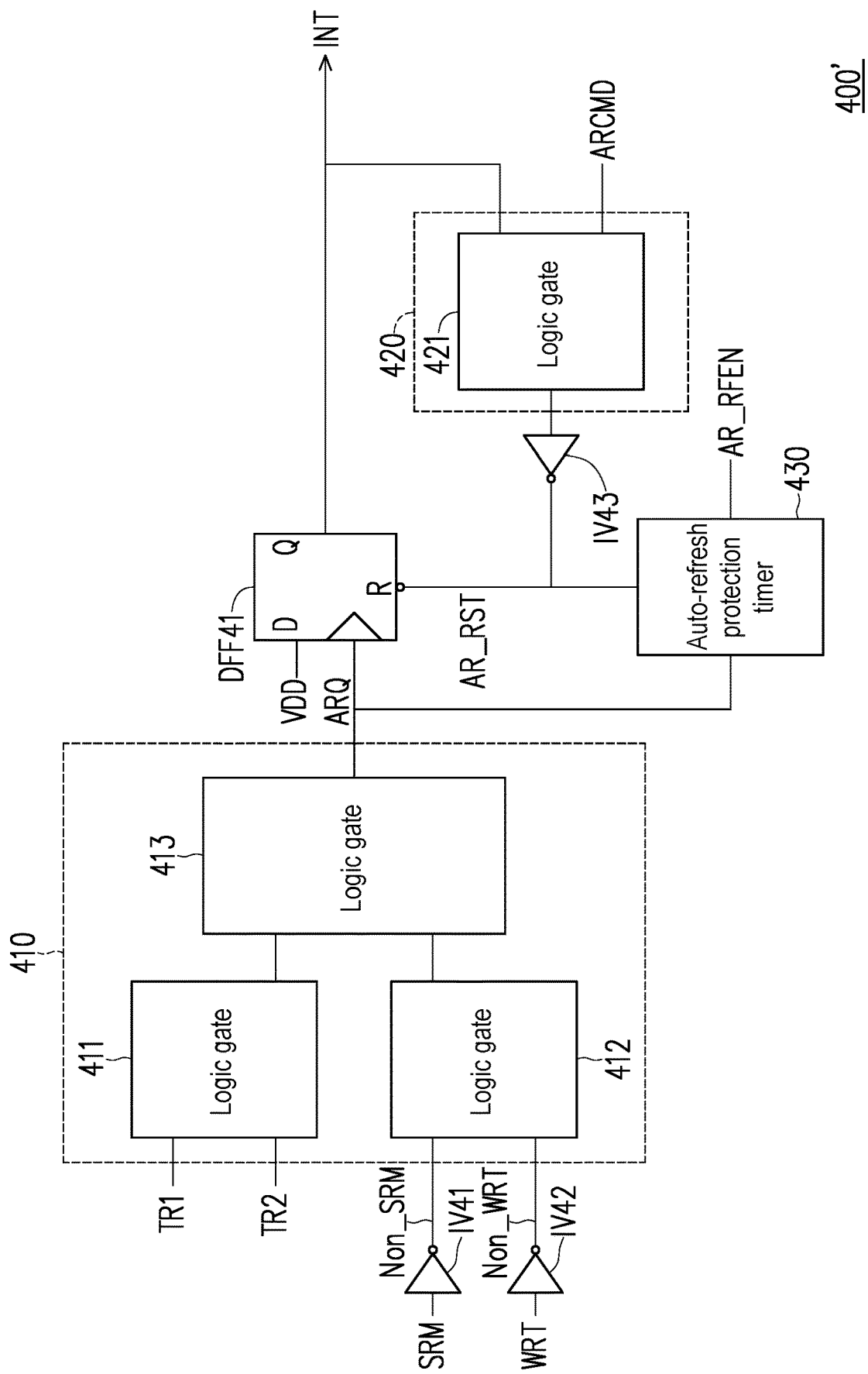

Referring to FIG. 4A and FIG. 4B, in FIG. 4A, an interrupt signal generator 400 includes logic operators 410, 420 and a flip-flop DFF41. The logic operator 410 is composed of logic gates 411-413. Where, inverters IV41 and IV42 respectively receive the internal self-refresh mode signal SRM and the access state WRT, and respectively generate the non-internal self-refresh mode signal Non-SRM and the non-access state Non-WRT. The logic gate 411 receives the timing result trigger signals TR1 and TR2 in the time-out state, and performs an OR logic operation on the timing result trigger signals TR1 and TR2 in the time-out state. The logic gate 412 receives the non-internal self-refresh mode signal Non-SRM and the non-access state Non-WRT, and performs an AND logic operation on the non-internal self-refresh mode Non-SRM signal and the non-access state Non-WRT. The logic gate 413 is coupled to output terminals of the logic gates 411 and 412, and performs an AND logic operation on the outputs of the logic gates 411 and 412 to generate an auto-refresh request signal ARQ.

Where, the timing result trigger signals TR1, TR2 are used to indicate whether the corresponding timers are in the time-out state, and in response to one of the timers being in the time-out state, the logic gate 411 may output logic 1, otherwise output logic 0. The non-internal self-refresh mode signal Non_SRM indicates whether the memory is operating in a non-internal self-refresh mode, and the non-access state Non_WRT indicates whether the memory is not being accessed. In response to the memory being operating in the non-internal self-refresh mode, and operated in a non-read/write mode, the logic gate 412 may output logic 1, otherwise output logic 0.

In the embodiment, the logic gate 411 may be an OR gate, or an equivalent logic circuit, and the logic gates 412 and 413 may be AND gates, or equivalent logic circuits.

Namely, the logic operator 410 outputs the auto-refresh request signal ARQ in response to the memory being operating in the non-internal self-refresh mode and in the non-read/write mode, and there is a timer that has completed the timing action and triggers the timer result trigger signals TR1-TRN.

A data terminal of the flip-flop DFF41 receives the power voltage VDD, and a clock terminal receives the auto-refresh request signal ARQ. In response to the auto-refresh request signal ARQ being triggered, an output terminal of the flip-flop DFF41 may output the interrupt signal INT equal to logic 1. On the other hand, a logic gate 421 in the logic operator 420 may receive the interrupt signal INT and an auto-refresh command ARCMD. The logic gate 421 performs an AND logic operation on the interrupt signal INT and the auto-refresh command ARCMD, and generates a reset signal AR_RST through an inverter IV43. In response to both of the interrupt signal INT and the auto-refresh command ARCMD being logic 1, the flip-flop DFF41 may be reset. The logic gate 421 may be an AND gate, or an equivalent logic circuit.

In the embodiment, the interrupt signal INT in the memory may be sent to an external controller. The controller may send the auto-refresh command ARCMD to the memory according to the interrupt signal INT. The memory may perform an auto-refresh operation according to the auto-refresh command ARCMD. Correspondingly, after the memory receives the auto-refresh (AR) command ARCMD, the interrupt signal INT may be reset to logic 0.

In addition, in FIG. 4B, compared with the embodiment in FIG. 4A, an interrupt signal generator 400' in FIG. 4B further includes an auto-refresh protection timer 430. The auto-refresh protection timer 430 resets a timing action according to the reset signal AR_RST, and starts the timing action according to the auto-refresh request signal ARQ. After the auto-refresh protection timer 430 starts the timing action according to the auto-refresh request signal ARQ, if the timer is time-out but has not received the valid reset signal AR_RST, the auto-refresh protection timer 430 may directly generate a refresh start signal RFEN to automatically start the auto-refresh operation of the memory to ensure that the data is not lost.

Figure 5:
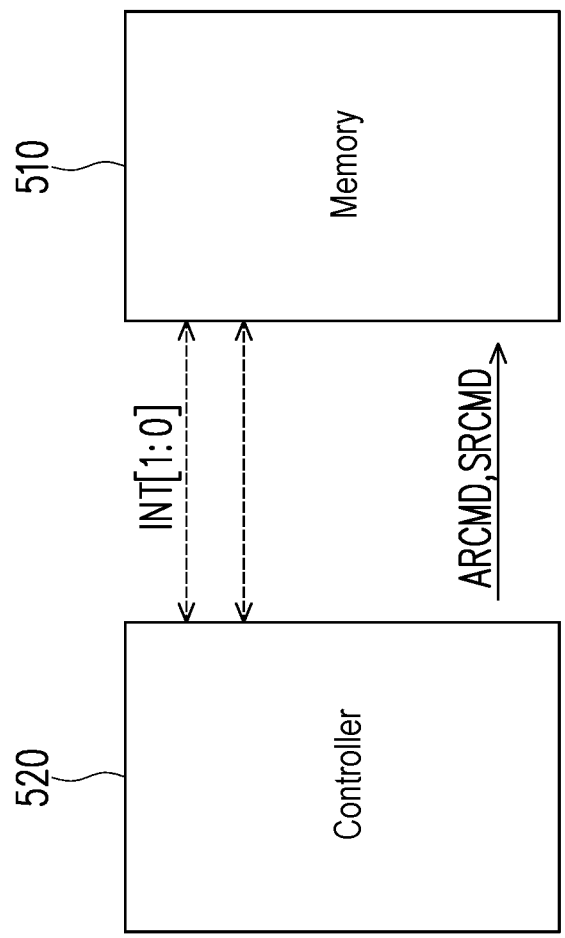
FIG. 5 is a schematic diagram of an electronic device according to another embodiment of the invention.

Referring to FIG. 5, an electronic device 500 includes a memory 510 and a controller 520. The controller 520 may transmit the self-refresh command SRCMD and the auto-refresh command ARCMD to the memory 510. The memory 510 may transmit an interrupt signal INT[1:0] having multiple bits to the controller 520. Where, the memory 510 may have multiple memory cell blocks. In response to one of the memory cell blocks satisfying a condition of performing the auto-refresh operation, the memory 510 may actively notify the controller 520 through the interrupt signal INT[1:0]. The controller 520 may timely transmit the auto-refresh command ARCMD to the memory 510 in response to the interrupt signal INT[1:0], so that the memory 510 may execute the auto-refresh operation at an appropriate time. Through a handshaking mechanism between the memory 510 and the controller 520, a conflict between the auto-refresh operation and other operations may be effectively avoided, so as to improve the working efficiency of the memory.

Figure 6:
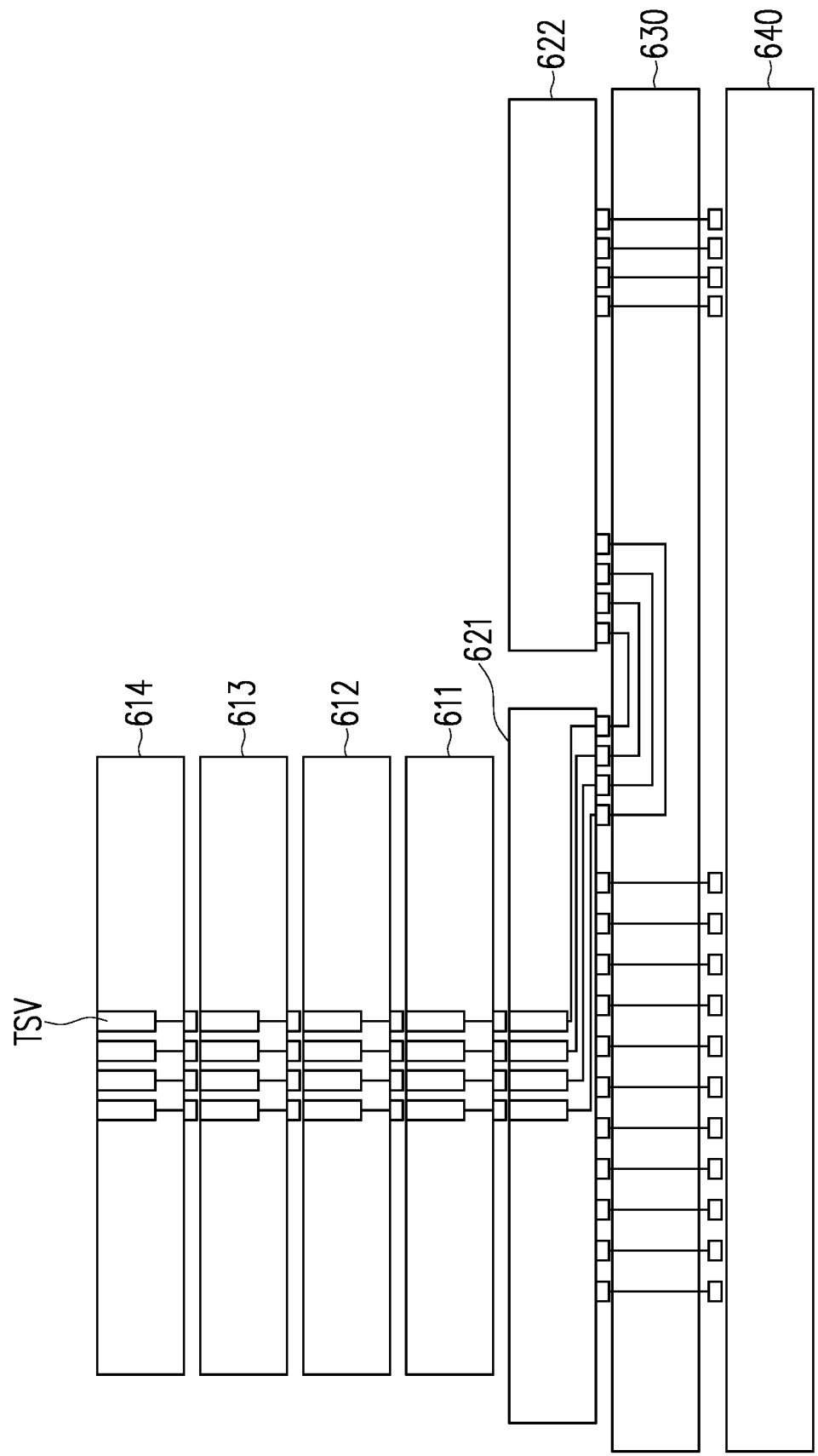
FIG. 6 is a schematic diagram of a three-dimensional structure of an electronic device according to an embodiment of the invention.

Referring to FIG. 6, an electronic device 600 includes a packaging substrate 640, an intermediate board 630, a logic circuit 621, a controller 622, and a plurality of memories 611-614. The memories 611-614 are stacked with each other in a three-dimensional structure, and may be electrically connected to each other through a plurality of through silicon vias TSVs. The logic circuit 621 is disposed under the memories 611-614 and used as an interface circuit of the memories 611-614. The controller 622 and the logic circuit 621 may be disposed on the same intermediate board 630, and are electrically connected to each other through wires on the intermediate board 630. The intermediate board 630 may be disposed on the packaging substrate 640.

In the embodiment, the logic circuit 621, the controller 622, and the memories 611-614 are all implemented in the form of chips, and are stacked to form a three-dimensional structure. The single controller 622 may control the refresh operation of the memories 611-614. Control details of the refresh operation have been described in the aforementioned embodiments and implementations, which will not be repeated below.

Figure 7:
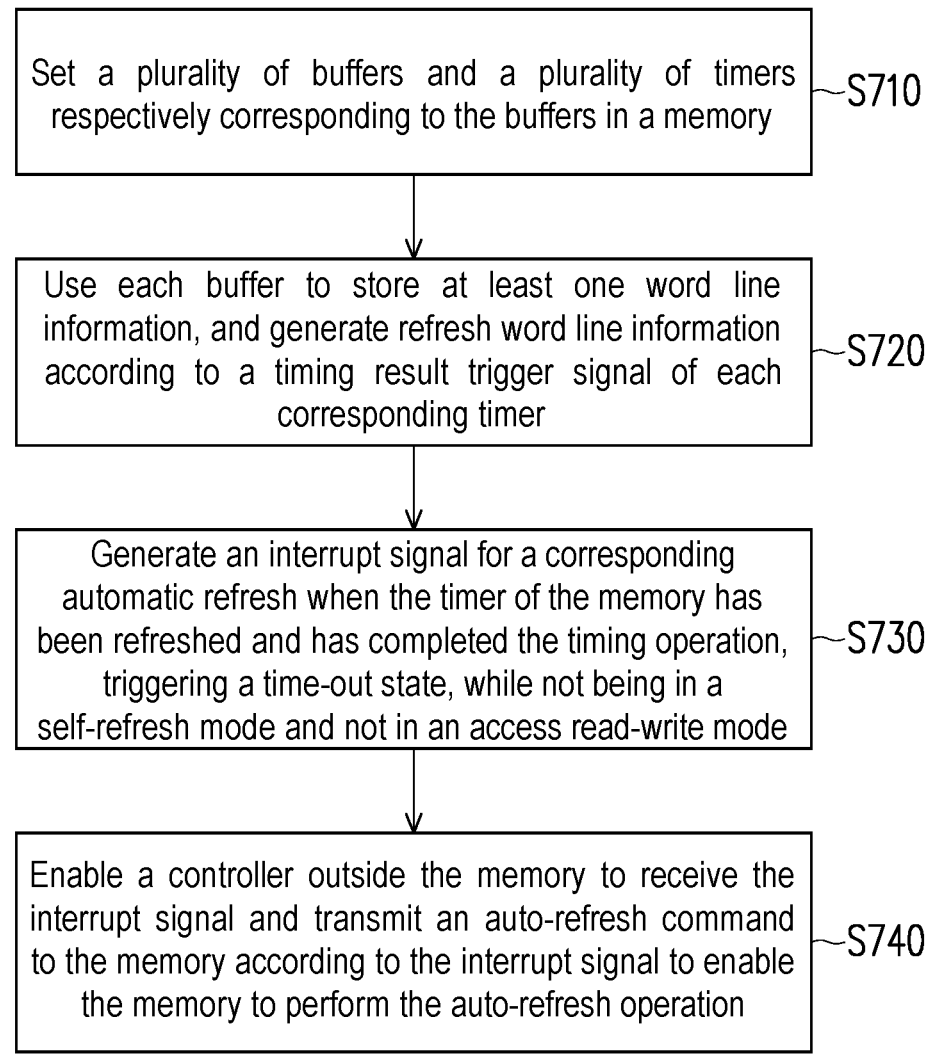
FIG. 7 is a flowchart of a control method for memory refresh operation according to an embodiment of the invention.

Referring to FIG. 7, in step S710, a plurality of buffers and a plurality of timers respectively corresponding to the buffers are set in the memory. In step S720, each buffer is used to store at least one word line information, and generate refresh word line information according to a timing result trigger signal of each corresponding timer. In step S730, an interrupt signal corresponding to an auto-refresh operation is generated by the memory according to the timing result trigger signals of the timers, a non-internal self-refresh mode signal and a non-access state. In addition, in step S740, a controller outside the memory is used to receive the interrupt signal and transmit an auto-refresh (AR) command to the memory according to the interrupt signal to enable the memory to perform the auto-refresh operation.

The implementation details of the above-mentioned steps have been described in detail in the aforementioned multiple embodiments and implementations, and details thereof will not be repeated here.

In summary, the memory of the invention may actively generate an interrupt signal to notify the controller when the auto-refresh operation needs to be performed, so that the controller may send an auto-refresh command to enable the memory to effectively execute the auto-refresh operation. In the embodiment of the invention, the memory may group word lines with different data retentions, and perform timing on the multiple word line groups separately to serve as a basis for triggering the refresh operation, so as to avoid the unnecessary refresh operations, which not only saves the power consumption required by the refresh operations but also improves usage performance of the memory.

What is claimed is:

1. An electronic device, comprising:
   a memory, comprising:
   a plurality of timers;
   a plurality of buffers, respectively coupled to the timers, and each of the buffers being configured to store at least one word line information and generate a refresh word line information according to a timing result trigger signal of each of the corresponding timers; and
   an interrupt signal generator, generating an interrupt signal corresponding to an auto-refresh operation according to a plurality of the timing result trigger signals of the timers, a non-internal self-refresh mode signal, and a non-access state; and
   a controller, coupled to the memory, receiving the interrupt signal and transmitting an auto-refresh command to the memory according to the interrupt signal to enable the memory to perform the auto-refresh operation.

2. The electronic device according to claim 1, wherein a plurality of word lines of the memory are divided into a plurality of word line groups according to data retentions, and each buffer stores the at least one word line information corresponding to each of the word line groups.

3. The electronic device according to claim 2, further comprising:
   a lookup table, configured to record a plurality of tags, wherein each of the tags indicates a corresponding relationship between each of the word lines and the buffers.

4. The electronic device according to claim 1, wherein the interrupt signal generator comprises:
   a first logic operator, performing a logic operation on the timing result trigger signals, an internal self-refresh mode signal and an access state to generate an auto-refresh request signal; and
   a flip-flop, generating the interrupt signal according to the auto-refresh request signal.

5. The electronic device according to claim 4, wherein the interrupt signal generator further comprises:
   a second logic operator, generating a reset signal according to the interrupt signal and the auto-refresh command, wherein the reset signal is sent to the flip-flop to reset the interrupt signal.

6. The electronic device according to claim 5, wherein the interrupt signal generator further comprises:
   an auto-refresh protection timer, reset according to the interrupt signal, starting a timing action according to the auto-refresh request signal, and generating a refresh start signal.

7. The electronic device according to claim 1, wherein the memory further comprises:

an arbitration circuit, coupled to the buffers, and respectively generating a plurality of trigger signals to trigger refresh operations according to the refresh word line information.

8. The electronic device according to claim 7, wherein the arbitration circuit further comprises:
a plurality of trigger signal generating circuits, respectively generating the trigger signals, and each of the trigger signal generating circuits comprising:
a flip-flop, having a data terminal receiving a power supply voltage, and a clock terminal of the flip-flop receiving the corresponding refresh word line information;
a latch, having a setting terminal coupled to an output terminal of the flip-flop, a reset terminal of the latch receiving the reset signal, and an output terminal of the latch generating the corresponding trigger signal; and
a delay circuit, coupled between the output terminal of the latch and a reset terminal of the flip-flop, and delaying each of the trigger signals to generate the reset signal.

9. The electronic device according to claim 1, wherein the timers respectively have a plurality of timing target values, and in response to timing values of each of the timers being equal to the corresponding timing target values, the corresponding buffers generate the corresponding refresh word line information.

10. The electronic device according to claim 9, wherein magnitudes of the timing target values are different from each other.

11. The electronic device according to claim 9, wherein the interrupt signal has at least one bit.

12. A control method for memory refresh operation, comprising:
setting a plurality of buffers and a plurality of timers respectively corresponding to the buffers in a memory;
using each of the buffers to store at least one word line information, and generate a refresh word line information according to a timing result trigger signal of each of the corresponding timer;
generating an interrupt signal corresponding to an auto-refresh operation by the memory according to a plurality of timing result trigger signals of the timers, a non-internal self-refresh mode signal, and a non-access state;
enabling a controller outside the memory to receive the interrupt signal and transmit an auto-refresh command to the memory according to the interrupt signal to enable the memory to perform the auto-refresh operation.

13. The control method for memory refresh operation according to claim 12, further comprising:
dividing a plurality of word lines of the memory into a plurality of word line groups according to data retentions; and
storing the at least one word line information corresponding to each of the word line groups in each of the buffers.

14. The control method for memory refresh operation according to claim 12, wherein generating the interrupt signal corresponding to the auto-refresh operation according to the non-access state comprises:
performing a logic operation on the timing result trigger signals, the non-internal self-refresh mode signal, and the non-access state to generate an auto-refresh request signal; and
providing a flip-flop to generate the interrupt signal according to the auto-refresh request signal.

15. The control method for memory refresh operation according to claim 14, further comprising:
performing a logic operation on the interrupt signal and the auto-refresh command to generate a reset signal; and
transmitting the reset signal to the flip-flop to reset the interrupt signal.

16. The control method for memory refresh operation according to claim 12, further comprising:
providing an arbitration circuit to respectively generate a plurality of trigger signals to trigger refresh operations according to the refresh word line information.

17. The control method for memory refresh operation according to claim 12, further comprising:
enabling the timers to respectively have a plurality of timing target values; and
enabling the corresponding buffers to generate the corresponding refresh word line information in response to timing values of each of the timers being equal to the corresponding timing target values.

18. The control method for memory refresh operation according to claim 17, wherein magnitudes of the timing target values are different from each other.

19. The control method for memory refresh operation according to claim 17, wherein the interrupt signal has at least one bit.

20. The control method for memory refresh operation according to claim 12, further comprising:
providing an auto-refresh protection timer to be reset according to the interrupt signal, starting a timing action according to the auto-refresh request signal, and generating a refresh start signal.

* * * * *